United States Patent [19]

Popovic

[11] Patent Number: 4,683,429
[45] Date of Patent: Jul. 28, 1987

[54] ELECTRICAL CIRCUIT WHICH IS LINEARLY RESPONSIVE TO CHANGES IN MAGNETIC FIELD INTENSITY

[75] Inventor: Radivoje Popovic, Zug, Switzerland

[73] Assignee: LGZ Landis & Gyr Zug AG, Zug, Switzerland

[21] Appl. No.: 642,407

[22] Filed: Aug. 20, 1984

[30] Foreign Application Priority Data

Aug. 26, 1983 [CH] Switzerland .......................... 4664/83

[51] Int. Cl.$^4$ ..................... G01N 27/72; G01R 33/02; H03K 17/90; H03K 19/18
[52] U.S. Cl. .................................. 324/225; 324/252; 307/309
[58] Field of Search ............... 324/225, 226, 251, 252, 324/224, 117 H; 307/309; 338/32 H, 32 R

[56] References Cited

U.S. PATENT DOCUMENTS 3,267,368 8/1966 Varian .
3,416,010 12/1968 Kuhnlein et al. .................... 324/251
4,100,563 7/1978 Clark ...................................... 357/27
4,449,081 5/1984 Doeman .............................. 324/251

FOREIGN PATENT DOCUMENTS 861403 2/1961 United Kingdom .
1251553 10/1971 United Kingdom .

Primary Examiner—Reinhard J. Eisenzopf
Assistant Examiner—Walter E. Snow
Attorney, Agent, or Firm—Marmorek, Guttman & Rubenstein

[57] ABSTRACT

A circuit including a magnetic sensing device for measuring magnetic fields is disclosed. The output of the magnetic sensing device is amplified by an amplifier and feedback to the magnetic sensing device. A potentiometer comprising two resistors $R_1$ and $R_2$ is connected between the output of the amplifier and ground. The feedback signal is taken from the common terminal of the two resistors. When circuit parameters are appropriately chosen, a magnetic field measuring circuit which is linearly responsive to changes in magnetic field intensity and relatively temperature independent results.

8 Claims, 4 Drawing Figures

ELECTRICAL CIRCUIT WHICH IS LINEARLY RESPONSIVE TO CHANGES IN MAGNETIC FIELD INTENSITY

FIELD OF INVENTION

This invention relates to a circuit including a magnetic-field sensor for measuring a magnetic field.

BACKGROUND OF THE INVENTION

Many magnetic-field sensors, such as Hall-effect elements, magnetotransistors, magfets, and magnetodiodes are known from the prior art. An example of a magnetically sensitive semiconductor device is disclosed in U.S. Pat. No. 4,100,563. Such magnetic field sensing devices usually have relatively low sensitivites to changes in magnetic field intensity. In addition, such devices may be non-linear and temperature-sensitive. It is the object of this invention to use relatively simple circuitry in connection with known magnetic field sensing devices, to achieve a magnetic-field sensing circuit which is linearly responsive to changes in magnetic-field intensity and relatively independent of temperature changes.

DESCRIPTION OF THE INVENTION

Figure 1:
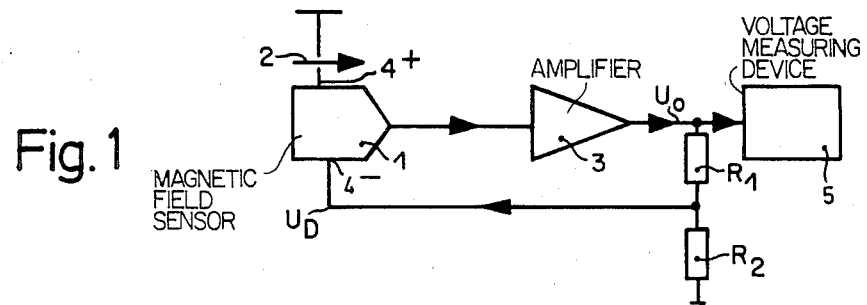
FIG. 1 schematically illustrates a circuit including a magnetic-field sensing device for measuring magnetic field intensities, in accordance with an illustrative embodiment of the invention.

Referring to FIG. 1, circuit for measuring magnetic-field intensities is illustrated. The circuit of FIG. 1 comprises a known magnetic-field sensing device 1, which is sensitive to a magnetic field 2, whose intensity is to be measured.

The output signal $U_{In}$ of the magnetic field sensing device 1 is connected to the input of the amplifier 3. The output signal $U_o$ of the amplifier 3 is fed into a potentiometer $R_{1,2}$ comprising first and second resistors $R_1$, $R_2$. The resistor $R_2$ has one terminal which is connected to ground. A signal $U_D$ taken from the common terminal of the resistors $R_1$, $R_2$ is connected with the input terminal 4− of the magnetic field sensing device 1, to form a feedback loop. In a preferred embodiment of the invention, the feedback is negative, as the output signal $U_{In}$ of the magnetic field sensing device 1 responds oppositely to changes in magnetic field intensity and the feedback signal $U_D$.

A voltage measuring device 5 is provided to measure the output signal of the amplifier 3. Magnetic-field sensing device 1, the resistors $R_1$, $R_2$, and the amplifier 3 are preferably combined as a single integrated circuit.

Figure 2:
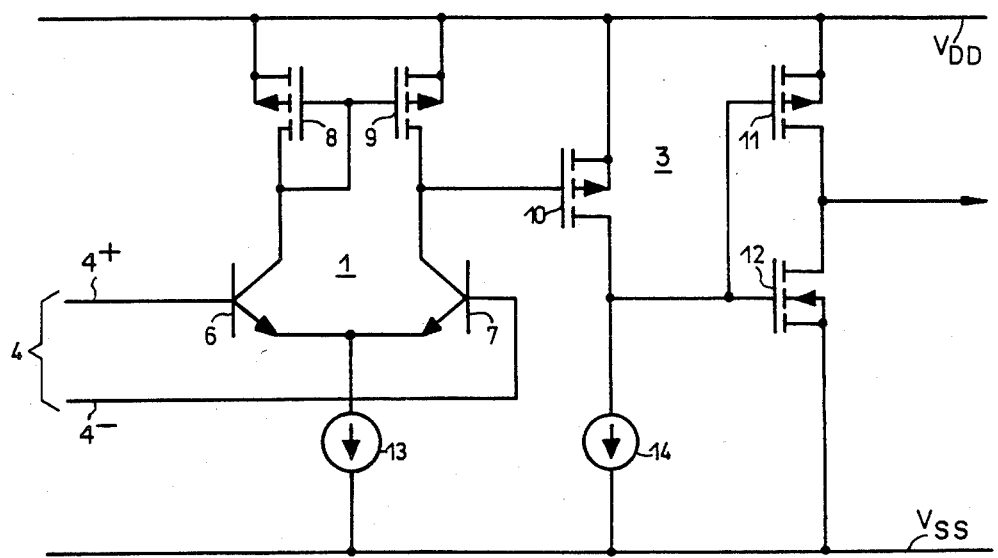
FIG. 2 is a circuit diagram of a magnetic field sensing device comprising bipolar transistors, the magnetic field sensing device being connected to an amplifier.

FIG. 2 shows a circuit diagram for a known magnetic field sensing device which is connected to an amplifier. The circuit of FIG. 2 comprises, for example, a first magnetic field sensitive bipolar npn transistor 6, a second magnetic-field sensitive bipolar npn transistor 7, a first PMOS transistor 8, a second PMOS transistor 9, a third PMOS transistor 10, a fourth PMOS transistor 11, a first NMOS transistor 12, a first n-channel current source 13 and a second n-channel current source 14. The two bipolar transistors 6 and 7 form together a known magnetic-field sensor 1 with their two base terminals forming two input terminals 4+ and 4−. The two emitters of the bipolar transistors 6 and 7 are connected with each other so that the transistors 6 and 7 form an emitter-coupled pair, which emitter-coupled pair forms a differential stage. The coupled emitters of the transistors 6 and 7 are connected through the first n-channel current source 13 to the negative pole $V_{SS}$ of a voltage source (not shown).

The collector terminals of the bipolar transistors 6 and 7 are coupled to the positive pole $V_{DD}$ of the voltage source through PMOS transistors 8 and 9. The source and substrate terminals of the PMOS transistors 8 and 9 are connected to the positive pole $V_{DD}$ of the voltage source and each of their drain terminals is connected to one collector terminal of the bipolar transistors 6 and 7. In addition, the gate terminals of the PMOS transistors 8 and 9 are connected to each other and to the drain terminal of one of the PMOS transistors 8 and 9. In FIG. 2 this is the drain terminal of the first PMOS transistor 8. The collector terminal of the second bipolar transistor 7 forms the output of magnetic-field sensor 1 and is connected to the gate terminal of the PMOS transistor 10. The drain terminal of the PMOS transistor 10 is connected directly to the gate terminal of the PMOS transistor 11 and to the gate terminal of the NMOS transistor 12. The drain terminal of the PMOS transistor 10 is also connected, through the second n-channel current source 14, to the negative pole $V_{SS}$ of the voltage source.

The source and substrate terminal of the PMOS transistors 10 and 11 are connected to the positive pole $V_{DD}$ of the voltage source. The source and substrate terminals of the NMOS transistor 12 are connected to the negative pole $V_{SS}$ of the voltage source. The two drain terminals of the PMOS and NMOS transistors 11 and 12 respectively are connected with each other as shown in FIG. 2. The PMOS transistors 10 and 11 and the NMOS transistor, 12 together form the amplifier 3, with the PMOS transistor 10 acting as a preamplifier and the transistors 11 and 12 acting as CMOS output amplifier whose output is the output voltage signal of the amplifier 3.

Figure 3:
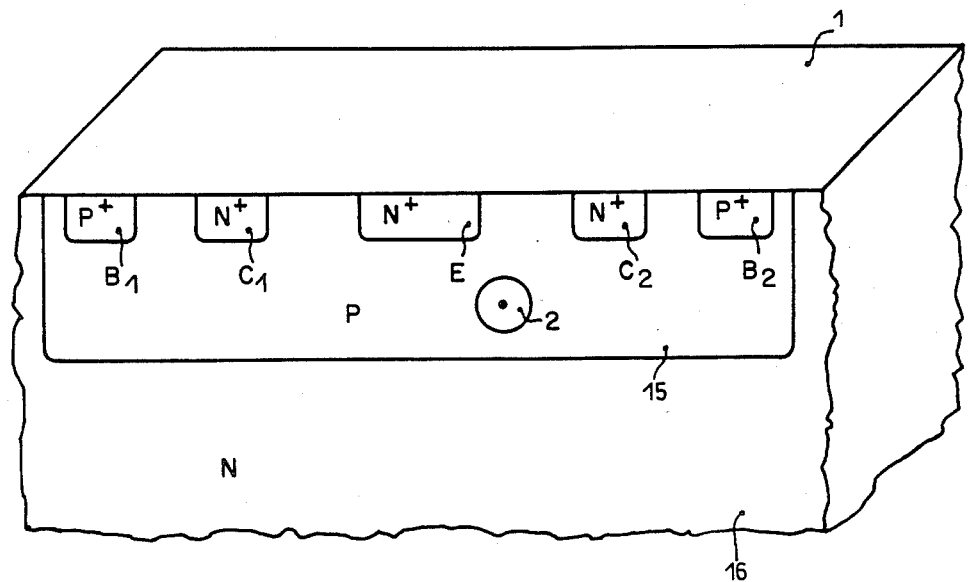
FIG. 3 schematically illustrates the spatial arrangement of the bipolar transistors of FIG. 2.

The two bipolar transistors 6 and 7 of FIG. 2 which together form the magnetic field-sensitive device 1 are preferably formed as a single substitute transistor with one emitter layer, two collector layers and two base layers. The spatial structure of the substitute transistor inside a semiconductor crystal is shown in FIG. 3. A well 15 of p-material slightly doped with impurities is diffused into a substrate 16 which consists of n-material also slightly doped with impurities. Diffused side by side into well 15 in the sequence indicated, as shown from left to right in FIG. 3, are: a first base region $B_1$ of p+material, a first collector region $C_1$ of n+material, a single central emitter region E of n+material, a second collector region $C_2$ of n+material, and a second base region $B_2$ of p+material, which regions are strongly doped with impurities. According to FIG. 3, the regions E, $C_1$ and $C_2$ comprise n+ material and the base regions $B_1$ and $B_2$ comprise p+ material.

Figure 4:
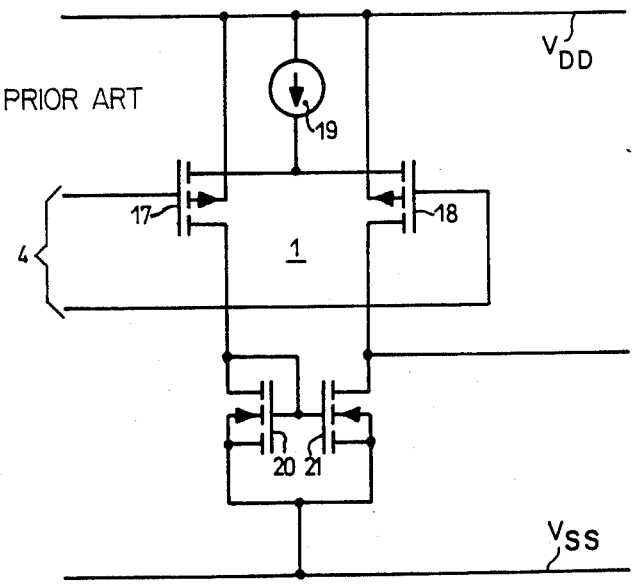
FIG. 4 shows a magnetic field sensing device formed from MOS transistors.

The magnetic-field sensing device 1 may be formed from MOS transistors instead of bipolar transistors. Such a magnetic-field sensor 1 is shown in FIG. 4. The bipolar transistors 6 and 7 are replaced by PMOS transistors 17 and 18. The two gate terminals of PMOS transistors 17 and 18 form the two-pole input 4 of magnetic-field sensor 1, while their substrate terminals are connected directly — and their source terminals are connected through the common p- channel current source 19 — to the positive pole $V_{DD}$ of the voltage source. Like bipolar transistors 6 and 7 of FIG. 2, source coupled transistors 17 and 18 of FIG. 4 are connected as a differential stage. The PMOS transistors 17 and 18 may be formed as a single split drain transistor.

The drain terminals of the PMOS transistors 17 and 18 are coupled to the negative pole $V_{SS}$ of the voltage source through NMOS transistors 20 and 21. The substrate and source terminals of NMOS transistors 20 and 21 are all connected to the negative pole $V_{SS}$ of the voltage source, while the drain terminals of NMOS transistors 20 and 21 are connected to the drain terminals of the PMOS transistors 17 and 18, respectively. The two gate terminals of the NMOS transistors 20 and 21 are connected to each other and to the drain terminal of one of the transistors 20 and 21, for example, to the drain terminal of the NMOS transistor 20. The drain terminal of the NMOS transistor 21 acts, for example, as the output of magnetic-field sensor 1. In particular situations, a single split-drain NMOS transistor can be used as a substitute for the two NMOS transistors 20 and 21. The split-drain NMOS transistor is equipped with two drain and two gate terminals.

The behavior of magnetic-field sensors of the type described above is generally known. Such magnetic-field sensors often have non constant low sensitivity to changes in magnetic-field intensity. Such devices are often characterized by nonlinearities and are temperature sensitive. The circuit shown in FIG. 1 is used to reduce these negative factors to a minimum.

The following definitions will be used below:
$H_2$: Intensity of the magnetic field 2 which is to be measured,
$K_H$: Sensitivity of the magnetic-field sensing device 1 to magnetic fields,
$K_E$: Sensitivity of magnetic-field sensing device 1 to electric voltages,
$U_{In}$: Input voltage of amplifier 3,
$K_V$: Voltage amplification factor of amplifier 3,
$U_O$: Output voltage of amplifier 3,
$K_D$: Damping factor of potentiometer $R_{1;2}$ with $K_D = R_2/(R_1+R_2)$, and,
$U_D$: Output voltage of potentiometer $R_{1;2}$.

The following equations apply to the circuit FIG. 1:

$$(H_2 \cdot K_H - U_D \cdot K_E) = U_{In} \qquad (1)$$

$U_D = K_D \cdot U_O$ and
$U_O = K_V \cdot U_{In}$.

Equation (1) is a direct result of the differential nature of the magnetic-field sensing device 1. As previously discussed FIGS. 2 and 4 show magnetic field sensors which are formed as differential stages. If the last two equations are used, equation (1) becomes:

$$(H_2 \cdot K_H - K_D \cdot U_O \cdot K_E) = U_O/K_V \text{ or}$$

$$H_2 \cdot K_H = (1/K_V + K_D \cdot K_E) \cdot U_O \text{ or}$$

$$H_2 = (1 + K_V \cdot K_D \cdot K_E) \cdot U_O/(K_V \cdot K_H) \qquad (2)$$

With $K_V \cdot K_D \cdot K_E >> 1$, which is easy to obtain by choosing a value $K_V >> 1$ for amplifier 3, equation (2) becomes:

$$H_2 = (K_D \cdot K_E) \cdot U_O/K_H \qquad (3)$$

As the sensitivies of magnetic-field sensor 1 to magnetic fields and to electric voltages are partly a function of identical physical mechanisms, the ratio $K_E/K_H$ can be considered as constant in a first approximation and given the symbol $K_{tot}$.

In this case, equation (3) is reduced to:

$$H_2 = K_D \cdot K_{tot} \cdot U_O = K \cdot U_O \qquad (4)$$

i.e., the output voltage $U_O$ of amplifier 3 is proportional to the value $H_2$ of the magnetic-field 2 which is to be measured. The constant proportionality factor is $K = K_D \cdot K_{tot}$, which in turn is a function of the resistance values $R_1$ and $R_2$ of the potentiometer $R_{1;2}$ and of the constant $K_{tot}$.

If, however, the ratio $(K_E/K_H) = K_{tot}$ is not constant, but, e.g., a function of a temperature, it is possible to add a temperature compensation feature by the appropriate choice of the temperature coefficients $\theta R_1$ and $\theta R_2$ of the two resistors $R_1$ and $R_2$ of potentiometer $R_{1;2}$. If the temperature coefficient of $K_{tot}$ is $\theta K_{tot}$, it is sufficient if the damping factor $K_D$ is given a temperature coefficient $\theta K_D$ which is equal in magnitude but opposite in sign to the temperature coefficient $\theta K_{tot}$, i.e., make $\theta K_D = -\theta K_{tot}$. This ensures that the proportionality factor $K = K_D \cdot K_{tot}$ in equation (4) is made independent of the temperature and that the value of the magnetic field intensity 2 being measured is proportional to the output voltage $U_O$ of amplifier 3.

The desired value and the desired sign of the temperature coefficient $\theta K_D$ of the damping factor $K_D = R_2/(R_1+R_2)$ may be obtained by forming the resistors $R_1$ and $R_2$ from different materials, so that the temperature coefficient $\theta R_1$ or $\theta R_2$ of one of the two resistors $R_1$ and $R_2$ dominate It is further assumed that $R_1 >> R_2$ and thus $K_D \approx R_2/R_1$. If it is necessary, for example, to obtain a negative value for the temperature coefficient $\theta K_D$, the second resistor $R_2$ in FIG. 4 is preferably formed from a source layer or drain layer strongly doped with impurities, and the first resistor $R_1$ from a diffusion-region layer slightly doped with impurities. In this case, the second resistor $R_2$ has a very low positive temperature coefficient $\theta R_2$ and the first resistor $R_1$ has a large positive temperature coefficient $\theta R_1$. The latter texperature coefficient therefore dominates and the damping factor $K_D$ has, a negative temperature coefficient as $R_1$ is in the denominator of the ratio $K_D = R_2/R_1$.

Another possibility for obtaining the two resistors $R_1$ and $R_2$ is to apply resistors made of different materials to the surface of the semiconductor, for example by vapor deposition.

In any case, the two resistors $R_1$ and $R_2$ and the magnetic-field sensor 1 which is sensitive to magnetic fields, should, if possible, be part of a single monolithic circuit and should be located as close as possible to each other, so that all of them are at the same temperature.

The circuits shown in FIGS. 1 to 4 are used, for example, in a electricity meter for measuring the magnetic field 2 generated by the current flowing through the meter.

Finally, the above-described embodiments of the invention are intended to be illustrative only. Numerous alternative embodiments may be devised by those skilled in the art without departing from the spirit and scope of the following claims.

We claim:

1. A circuit for measuring the intensity of a magnetic field, said circuit comprising:

(a) a magnetic field sensing device for sensing said magnetic field intensity, said magnetic field sensing device being adapted to produce an electrical output signal ($U_{in}$), said electrical output signal ($U_{in}$) being dependent on an electrical input signal ($U_D$) received at an electrical control input and said magnetic field intensity, the electrical output signal ($U_{in}$) of said magnetic field sensing device having a sensitivity ($K_H$) to said magnetic field intensity and a sensitivity ($K_E$) to said electrical input signal ($U_D$);

(b) an amplifier, said amplifier being adapted to receive said electrical output signal of said magnetic sensing device ($U_{in}$) and amplify said electrical output signal of said magnetic sensing device ($U_{in}$) by an amplification factor ($K_V$) to produce an amplified output signal ($U_O$).

(c) a potentiometer, said potentiometer being adapted to receive said amplified output signal ($U_O$) and damp said amplifier output signal ($U_O$) by a damping factor ($K_D$) to produce said electrical input signal ($U_D$) Wherein $U_D = U_O K_D$ and (d) feedback means for connecting said potentiometer to said electrical control input of said magnetic field sensing device, so that said magnetic field sensing device can receive said input signal ($U_D$) from said potentiometer, said magnetic field sensing device, said amplifier and said potentiometer being adapted so that the product of (i) the sensitivity ($K_E$) of said magnetic field sensing device to said electrical input signal ($U_D$);

(ii) the amplification factor ($K_V$) of said amplifier; and (iii) the damping factor ($K_D$) of said potentiometer, is much greater than unity, so that said amplifier output signal ($U_O$) is substantially linearly related to said magnetic field intensity.

2. The circuit of claim 1, wherein the damping factor ($K_D$) of said potentiometer has a temperature coefficient ($\theta K_D$) whose sign is opposite to the sign of a temperature coefficient ($\theta K_{tot}$) of the ratio ($K_E/K_H$) of the sensitivity ($K_E$) of the magnetic-field sensing device to said electrical input signal ($U_D$) and the sensitivity ($K_H$) of the magnetic-field sensing device to said magnetic field intensity.

3. The circuit of claim 2, wherein said potentiometer comprises first and second resistors ($R_1, R_2$), said first resistor ($R_1$) having a resistance greater than that of said second resistor ($R_2$), said resistors ($R_1, R_2$) being formed from different materials so that the temperature coefficient of one of said resistors ($R_1, R_2$) is much larger than the temperature coefficient of the other resistor.

4. The circuit according to claim 2, wherein the absolute value of the temperature coefficient ($\theta K_D$) of the damping factor ($K_D$) is substantially equal in magnitude to the temperature coefficient ($\theta K_{tot}$) of said ratio ($K_E/K_H$).

5. The circuit of claim 1, wherein the magnetic-field sensing device comprises two transistors which form a differential stage.

6. The circuit of claim 1, wherein the magnetic-field sensing device comprises a transistor with one emitter layer, two collector layers and two base layers, said transistor forming a differential stage.

7. The circuit of claim 1, wherein the magnetic-field sensing device comprises a split drain transistor which forms a differential stage.

8. The circuit as claimed in claim 3, wherein the absolute value of the temperature coefficient ($\theta K_D$) of the damping factor ($K_D$) is substantially equal in magnitude to the temperature coefficient ($\theta K_{tot}$) of said ratio ($K_E/K_H$).

* * * * *